US007859353B2

(12) United States Patent
Liu et al.

(10) Patent No.: US 7,859,353 B2
(45) Date of Patent: Dec. 28, 2010

(54) OSCILLATOR AND DRIVING CIRCUIT AND OSCILLATION METHOD THEREOF

(75) Inventors: Yu-Chia Liu, Kaohsiung (TW); Yu-Tong Lin, Hsinchu County (TW)

(73) Assignee: Phison Electronics Corp., Miaoli (TW)

( * ) Notice: Subject to any disclaimer, the term of this patent is extended or adjusted under 35 U.S.C. 154(b) by 102 days.

(21) Appl. No.: 12/270,698

(22) Filed: Nov. 13, 2008

(65) Prior Publication Data

US 2010/0066458 A1    Mar. 18, 2010

(30) Foreign Application Priority Data

Sep. 12, 2008    (TW) .............................. 97135244 A

(51) Int. Cl.
*H03B 5/30*    (2006.01)
*H03L 5/00*    (2006.01)
(52) U.S. Cl. .................... 331/160; 331/116 R; 331/158; 331/183
(58) Field of Classification Search ............. 331/116 R, 331/154, 158, 160, 182, 183, 185, 186
See application file for complete search history.

(56) References Cited

U.S. PATENT DOCUMENTS

| | | | | | |
|---|---|---|---|---|---|
| 4,956,618 | A | * | 9/1990 | Ulmer | 331/116 FE |
| 5,557,243 | A | * | 9/1996 | Ho | 331/158 |
| 5,982,246 | A | * | 11/1999 | Hofhine et al. | 331/116 FE |
| 6,118,348 | A | * | 9/2000 | Narahara | 331/116 FE |
| 6,133,801 | A | * | 10/2000 | Tanaka | 331/158 |
| 7,030,709 | B2 | * | 4/2006 | Novac | 331/158 |
| 7,123,113 | B1 | * | 10/2006 | Brennan et al. | 331/158 |
| 7,138,881 | B2 | * | 11/2006 | Lin | 331/158 |
| 7,348,861 | B1 | * | 3/2008 | Wu et al. | 331/158 |
| 2007/0024385 | A1 | * | 2/2007 | Greenberg | 331/158 |

* cited by examiner

*Primary Examiner*—Robert Pascal
*Assistant Examiner*—Levi Gannon
(74) *Attorney, Agent, or Firm*—J.C. Patents

(57) ABSTRACT

An oscillator, a driving circuit and an oscillation method are provided. The driving circuit and a crystal are coupled in parallel to generate a clock signal. The driving circuit includes a buffer unit and a control unit. The buffer unit is coupled in parallel to the crystal, and used to amplify an oscillation signal outputted from the crystal to generate the clock signal. The control unit is coupled to the buffer unit, and used to generate a control signal to the buffer unit. The control unit determines a voltage level of the control signal by detecting whether the clock signal or the oscillation signal satisfies an oscillation condition of the crystal, so as to control a gain value of the buffer unit. Therefore, noise of different frequency bands loaded into the clock signal can be avoided.

28 Claims, 7 Drawing Sheets

OSCILLATOR AND DRIVING CIRCUIT AND OSCILLATION METHOD THEREOF

CROSS-REFERENCE TO RELATED APPLICATION

This application claims the priority benefit of Taiwan application serial no. 97135244, filed on Sep. 12, 2008. The entirety of the above-mentioned patent application is hereby incorporated by reference herein and made a part of specification.

BACKGROUND OF THE INVENTION

1. Field of the Invention

The present invention relates to an oscillator. More particularly, the present invention relates to an oscillator, a driving circuit and an oscillation method thereof, which can avoid loading noise of different frequency bands into a clock signal.

2. Description of Related Art

With development of technology, electronic products are continually innovated. Normal operation of the electronic product depends on an oscillator providing clocks. Based on the precise clock generated by the oscillator, internal chips of the electronic product can sequentially process received data or signals and transmit the processed data or signal to a next stage circuit at a correct time. A quartz oscillator can not only provide the precise clock, but also has a feature of not being influenced by factors such as temperature, humidity, fabrication process and operation voltage, etc. Therefore, the quartz oscillators are applied to most of the electronic products for providing the required clock.

FIG. 1 is a circuit diagram of a conventional oscillator. Referring to FIG. 1, the oscillator 100 includes a crystal 101, an inverter 102, a resistor R and a capacitor C. Since a mechanical-electrical resonance of the crystal 101 is quite stable, the oscillator 100 can output a relatively stable clock signal based on the above characteristic of the crystal 101. However, whether oscillation of the oscillator can be started is influenced by a quality of the crystal 101, and a waveform of a clock signal Xtal_out generated after the oscillation is also influenced by a quality of the crystal 101.

Generally, when a designer designs the oscillator 100, the quality of the crystal 101 cannot be known in advance. To eliminate a possibility that the oscillation of the oscillator 100 cannot be started due to a quality difference of the crystal 101, the inverter 102 with relatively great amplification is generally applied to the oscillator 100 for actuating the oscillation starting of the oscillator 100.

However, the inverter 102 with the relatively great amplification can also amplify amplitude of the clock signal Xtal_out generated after the oscillation starting of the crystal 101, which may lead to a full swing of the waveform thereof. Such full swing waveform is liable to be loaded with noises of different frequency bands, which can lead to instability of the waveform of the clock signal Xtal_out, and can influence a frequency of the clock signal Xtal_out.

For the oscillator, an optimal oscillation waveform is a sine waveform, which is not liable to be loaded with noises of different frequency bands, and the frequency of the provided clock signal is the most stable. However, for the oscillator applying the inverter with the relatively great amplification, due to the influence of the full swing waveform, if the quality of the utilized crystal is poor, the noises of different frequency bands generated by the crystal can be amplified, so that the waveform and frequency of the clock signal of the oscillator are influenced.

SUMMARY OF THE INVENTION

The present invention is directed to a driving circuit, which can control a gain of a buffer according to a voltage level of a clock signal or an oscillation signal.

The present invention is directed to an oscillator, which can avoid loading noise of different frequency bands into a clock signal.

The present invention is directed to an oscillation method, by which after oscillation of a clock signal is stable, a gain of a buffer is decreased, so as to avoid excessive amplification of noises generated by a crystal.

The principle aspect of the present invention provides a driving circuit suitable for being coupled in parallel to a crystal to generate a clock signal. The driving circuit includes a buffer unit and a control unit. The buffer unit is coupled in parallel to the crystal, and used to amplify an oscillation signal outputted from the crystal to generate the clock signal. The control unit is coupled to the buffer unit, and used to generate a control signal to the buffer unit. The control unit determines a voltage level of the control signal by detecting whether the clock signal or the oscillation signal satisfies an oscillation condition of the crystal, so as to control a gain of the buffer unit.

Another aspect of the present invention provides an oscillator including a crystal and a driving circuit, and wherein the driving circuit includes a buffer unit and a control unit. The driving circuit is coupled in parallel to the crystal, and used to generate a clock signal. The buffer unit is coupled in parallel to the crystal, and used to amplify an oscillation signal outputted from the crystal to generate the clock signal. The control unit is coupled to the buffer unit, and used to generate a control signal to the buffer unit. The control unit determines a voltage level of the control signal by detecting whether the clock signal or the oscillation signal satisfies an oscillation condition of the crystal, so as to control a gain of the buffer unit.

Additional aspect of the present invention also provides an oscillation method for driving an oscillator having a crystal, so as to generate a clock signal. The method can be described as follows. First, an oscillation signal output from the crystal is amplified to generate the clock signal. Next, whether the clock signal or the oscillation signal satisfies an oscillation condition of the crystal is detected. Finally, an amplification gain of the oscillation signal is controlled according to a detecting result, and wherein the detecting result represents whether the clock signal or the oscillation signal satisfies an oscillation condition of the crystal.

According to the oscillator and driving circuit and oscillation method of the present invention, whether the crystal is stably oscillated is confirmed by detecting the clock signal or the oscillation signal, and after the oscillation is stable, an amplification gain of the clock signal is reduced so as to avoid excessive amplification of the noise generated by the crystal. By such means, noise of different frequency bands loaded into the clock signal can be avoided, so as to improve a stability of the frequency of the clock signal.

In order to make the aforementioned and other objects, features and advantages of the present invention comprehensible, a preferred exemplary embodiment accompanied with figures is described in detail below.

BRIEF DESCRIPTION OF THE DRAWINGS

The accompanying drawings are included to provide a further understanding of the invention, and are incorporated in and constitute a part of this specification. The drawings illustrate exemplary embodiments of the invention and, together with the description, serve to explain the principles of the invention.

DESCRIPTION OF EXEMPLARY EMBODIMENTS

To avoid influences on frequency and waveform of a clock signal caused by an oscillator applying the poor quality crystal, the present invention provides an oscillator and a driving circuit and an oscillation method thereof to reduce an amplification gain of the oscillation signal, so as to mitigate the influence caused by the poor quality crystal. To fully convey the spirit of the present invention, exemplary embodiments are provided bellow for detailed description.

Figure 1:
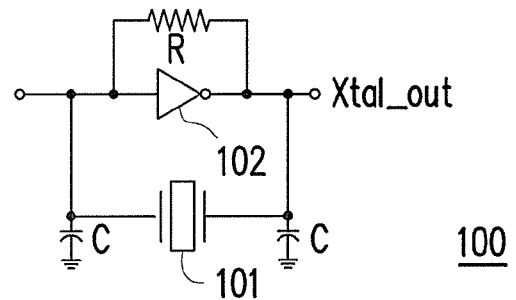
FIG. 1 is a circuit diagram of a conventional oscillator.
Figure 2A:
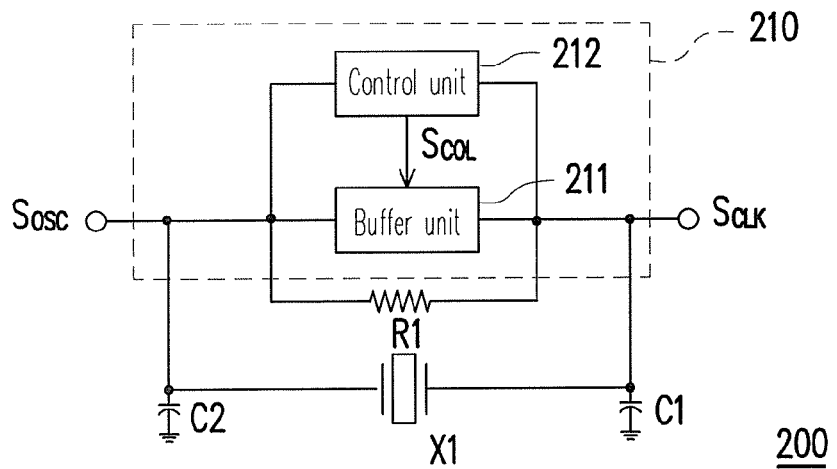
FIG. 2A is a system block diagram illustrating an oscillator according to an exemplary embodiment of the present invention.

FIG. 2A is a system block diagram illustrating an oscillator according to an exemplary embodiment of the present invention. Referring to FIG. 2A, the oscillator 200 includes a crystal X1, a driving circuit 210, capacitors C1 and C2, and a resistor R1. The driving circuit 210 is coupled in parallel to the crystal X1. The capacitor C1 is coupled between one terminal of the crystal X1 and a ground voltage. The capacitor C2 is coupled between another terminal of the crystal X1 and the ground voltage. The resistor R1 is coupled in parallel to a buffer unit 211. The buffer unit 211 is coupled in parallel to the crystal X1. The buffer unit 211 is used to amplify an oscillation signal $S_{OSC}$ output from the crystal X1, and to output the amplified signal as a clock signal $S_{CLK}$. The capacitor C2 filters a noise of the oscillation signal $S_{OSC}$, and the capacitor C1 and the resistor R1 modify a waveform of the clock signal $S_{CLK}$ according to electrical characteristics thereof, so as to trim the waveform of the clock signal $S_{CLK}$ to close to a sine waveform. Meanwhile, the resistor R1 determines a direct current (DC) voltage level of the control signal. Then, the crystal X1 again converts the clock signal $S_{CLK}$ into the oscillation signal $S_{OSC}$, and the converted oscillation signal $S_{OSC}$ is again amplified by the buffer unit 211 to generate the clock signal $S_{CLK}$, so as to oscillate the oscillator.

The control unit 212 is coupled to the buffer unit 211, and generates a control signal $S_{COL}$ to the buffer unit 211. The control unit 212 determines a voltage level of the control signal $S_{COL}$ by detecting whether the clock signal $S_{CLK}$ or the oscillation signal $S_{OSC}$ satisfies an oscillation condition of the crystal X1. An amplification gain of the buffer unit 211 is controlled according to the voltage level of the control signal $S_{COL}$. The oscillation condition is for example a condition that amplitude of the oscillation signal $S_{OSC}$ is greater than a predetermined value, or amplitude of the clock signal $S_{CLK}$ is greater than the predetermined value. Wherein the predetermined value can be set to amplitude that is great enough to drive the control unit 211 to switch the voltage level of the control signal $S_{COL}$, and the predetermined value can be designed by those skilled in the art.

For example, when the oscillator 200 is just powered, the amplitude of the oscillation signal $S_{OSC}$ is about zero, and since the buffer unit 211 can inversely amplify the amplitude of the oscillation signal $S_{OSC}$, oscillation of the oscillator 200 is started, and the amplitude of the oscillation signal $S_{OSC}$ is gradually increased. To quickly start the oscillation of the oscillator 200, during starting of the oscillation, the buffer unit 211 applies a relatively great gain. Here, assuming a maximum gain of the buffer unit 211 is 10, and the maximum gain can be varied according to actual requirements. Before the amplitude of the oscillation signal $S_{OSC}$ reaches the predetermined value, it represents that the oscillator 200 is not stably oscillated. Now, the oscillator 200 still requires the relatively great gain to accelerate the oscillation starting of the crystal X1, and the control unit 212 can output the control signal $S_{COL}$ having a logic high voltage level (for example, a system voltage VCC). When the buffer unit 211 receives the control signal $S_{COL}$ having the logic high voltage level, it represents that the oscillator 200 still requires the relatively great gain, so that the buffer unit 211 can adjust the gain thereof to be 10.

After the oscillation is started for a while, the amplitude of the oscillation signal $S_{OSC}$ can be greater than the predetermined value, which represents that the oscillation of the crystal X1 is stable. Now, the oscillator 200 only requires a low gain to maintain the oscillation, so that the control unit can output the control signal $S_{COL}$ having a logic low voltage level (for example, the ground voltage). When the buffer unit 211 receives the control signal $S_{COL}$ having the logic low voltage level, it represents that the oscillator 200 does not require the relatively great gain, so that the buffer unit 211 can adjust the gain thereof to a lower value (for example, to be 1) for providing to the oscillator 200 to maintain the oscillation. By such means, after the oscillation of the oscillator 200 is stable, excessive amplification of the noise of different frequency bands generated by the crystal X1 can be avoided, so as to avoid loading the noise into the clock signal $S_{CLK}$.

Moreover, it should be noted that in the aforementioned exemplary embodiment, though it is assumed that the gain of the buffer unit 211 is 10 when the oscillation of the oscillator 200 is just started, and after the oscillation of the oscillator 200 is stable, the gain of the buffer unit 211 is 1, it is only an exemplary embodiment, and those skilled in the art can design the gain of the buffer unit 211 when the oscillation of the oscillator 200 is just started, and the gain of the buffer unit 211 after the oscillation of the oscillator 200 is stable according to the spirit of the present invention. Moreover, in the aforementioned exemplary embodiment, though it is assumed that when the buffer unit 211 receives the control signal $S_{COL}$ having the logic high voltage level, it represents that the oscillator 200 still requires the relatively great gain, it is only an exemplary embodiment, and those skilled in the art can design a signal meaning of the control signal $S_{COL}$ according to the spirit of the present invention.

Figure 2B:
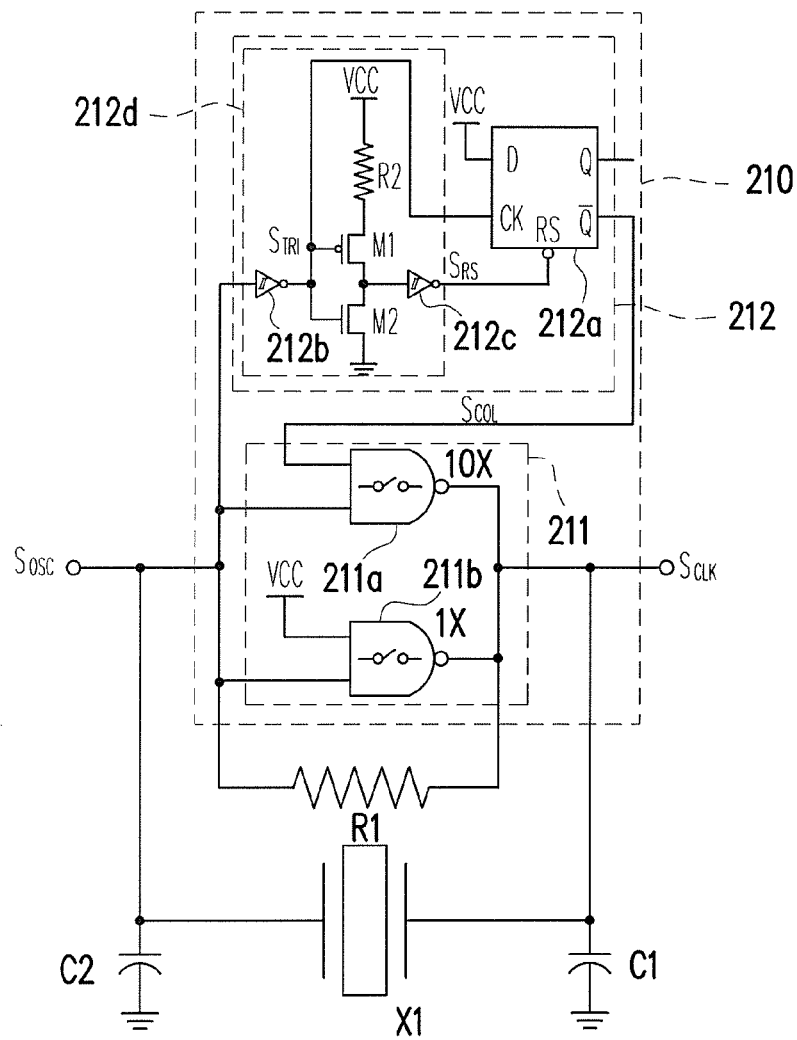
FIG. 2B is a circuit diagram illustrating an oscillator of FIG. 2A.

In the following content, another exemplary embodiment is provided for those skilled in the art to fully convey the spirit of the present invention. FIG. 2B is a circuit diagram illustrating an oscillator of FIG. 2A. Referring to FIG. 2A and FIG. 2B, in the present exemplary embodiment, the buffer unit 211 includes a first driving device 211a and a second driving device 211b. The first and second driving devices 211a and 211b are for example, NAND gates. However, those skilled in the art should understand that OR gates (with input terminals coupling NOT gates) or other logic circuits equivalent to the NAND gate can also be applied. For simplicity's sake, a gain of the second NAND gate 211b is set to 1, and a gain of the first NAND gate 211a is greater than that of the second NAND gate 211b. Here, the gain of the first NAND gate 211a is set to 10, and the gains of the NAND gates 211a and 211b can be varied according to a design requirement. The control unit 212 includes a first latch module 212a and a detecting module 212d. The detecting module 212d includes a first trigger 212b, a second trigger 212c, a first transistor M1, a second transistor M2 and a resistor R2. Wherein the first latch module 212a is a D-type latch, the first transistor M1 and the second transistor M2 are respectively a PMOS transistor and a NMOS transistor, and the first trigger 212b and the second trigger 212c are for example, Schmitt triggers.

The first trigger 212b has a first terminal and a second terminal. Wherein the first terminal of the first trigger 212b is coupled to the crystal X1, and the second terminal of the first trigger 212b is coupled to a trigger terminal CK of the latch 212a. A first terminal of the resistor R2 is coupled to the system voltage VCC, and a second terminal thereof is coupled to a source of the first transistor M1. A drain of the first transistor M1 is coupled to a first terminal of the second trigger 212c, and a gate of the first transistor M1 is coupled to the second terminal of the first trigger 212b. A drain of the second transistor M2 is coupled to the first terminal of the second trigger 212c, a source of the second transistor M2 is coupled to the ground voltage, and a gate of the second transistor M2 is coupled to the second terminal of the first trigger 212a.

The latch 212a has an input terminal D, an inverting output terminal $\overline{Q}$, the trigger terminal CK and a reset terminal RS. Wherein the input terminal D is coupled to the system voltage VCC, and the trigger terminal CK is coupled to the second terminal of the first trigger 212b. The trigger terminal CK receives a trigger signal $S_{TRI}$, and the reset terminal RS is coupled to the second terminal of the second trigger 212c. The reset terminal RS receives a reset signal $S_{RS}$. The first NAND gate 211a has a first terminal, a second terminal and an output terminal, and wherein the first terminal thereof is coupled to the inverting output terminal $\overline{Q}$ of the first latch 212a. The first terminal of the first NAND gate 221a receives the control signal $S_{COL}$, and the second terminal and the output terminal of the first terminal of the first NAND gate 221a are coupled to the crystal X1 in parallel. The second NAND gate 211b has a first terminal, a second terminal and an output terminal. Wherein the first terminal of the second NAND gate 211b is coupled to the system voltage VCC, and the second terminal and the output terminal of the second NAND gate 211b are coupled to the crystal X1 in parallel.

Figure 2C:
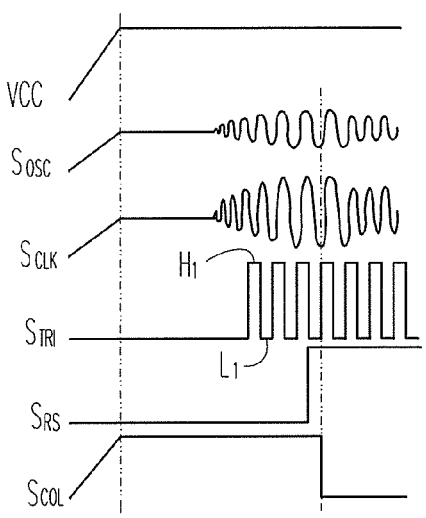
FIG. 2C is a waveform diagram of a system voltage, a trigger signal, a reset signal, a control signal, an oscillation signal and a clock signal of FIG. 2B.

FIG. 2C is a waveform diagram of the system voltage VCC, the trigger signal $S_{TRI}$, the reset signal $S_{RS}$, the control signal $S_{COL}$, the oscillation signal $S_{OSC}$ and the clock signal $S_{CLK}$ of FIG. 2B. Referring to FIGS. 2B and 2C, as the system voltage VCC increases, internal components of the oscillator 200 may also generate voltages corresponding to the voltage level of the system voltage VCC, and the triggers 212b and 212c are preset to output the logic low voltage level. When the system voltage VCC is stable, the internal components of the oscillator 200 can operate normally. Now, since the trigger 212c is preset to output the logic low voltage level (i.e. the reset signal $S_{RS}$), the latch 212a is in a reset state, namely, the output terminal $\overline{Q}$ of the latch 212a outputs the logic low voltage level, and the inverting output terminal $\overline{Q}$ of the latch 212a outputs the logic high voltage level (i.e. the control signal $S_{COL}$).

In the buffer unit 211, the first terminal of the NAND gate 211a now receives the control signal $S_{COL}$ having the logic high voltage level, so that the NAND gate 211a inversely amplifies the oscillation signal $S_{OSC}$ received from the second terminal thereof. Since the first terminal of the NAND gate 211b is coupled to the system voltage VCC (the logic high voltage level), the NAND gate 211b inversely amplifies the oscillation signal $S_{OSC}$ received from the second terminal thereof. Now, the NAND gates 211a and 211b of the buffer unit 211 both inversely amplify the oscillation signal $S_{OSC}$, so that an amplification gain of the buffer unit 211 equals a sum of the gain of the NAND gate 211a and the gain of the NAND gate 211b (i.e. the gain is 11). By amplifying the oscillation signal $S_{OSC}$, the oscillation starting of the crystal X1 can be accelerated.

Next, though the amplification gain of the buffer unit 211 is 11, since the amplitude of the oscillation signal $S_{OSC}$ at the beginning is almost zero, the amplitudes of the oscillation signal $S_{OSC}$ and the clock signal $S_{CLK}$ at the beginning are relatively small. After multi resonance of the crystal X1 and multi amplifications of the buffer unit 211, the amplitudes are gradually amplified. When the amplitude of the oscillation signal $S_{OSC}$ is amplified to a degree that a peak and a trough voltage levels are great enough to drive the trigger 212b to change the voltage level of the output signal thereof, the trigger 212b can generate the trigger signal $S_{TRI}$ with a narrow square waveform or a pulse waveform in response to the oscillation signal $S_{OSC}$. Now the amplitude of the oscillation signal $S_{OSC}$ is great enough to drive the trigger 212b to change the voltage level of the trigger signal $S_{TRI}$, and meanwhile the trigger 212c is indirectly triggered to switch the voltage level of the output reset signal $S_{RS}$. In the case, the current clock signal $S_{CLK}$ or the oscillation signal $S_{OSC}$ satisfies the oscillation condition of the crystal X1.

Referring to the trigger signal $S_{TRI}$ and the reset signal $S_{RS}$ of FIG. 2B and FIG. 2C, when the level of the trigger signal $S_{TRI}$ is a logic high voltage level H1, since the transistor M1 can be turned on in response to the logic low voltage level, and the transistor M2 can be turned on in response to the logic high voltage level, the transistor M2 is now turned on, so that the ground voltage is transmitted to the trigger 212c. Since the trigger 212c is preset to output the logic low voltage level, the voltage level of the reset signal $S_{RS}$ is the logic low voltage level before the trigger 212c receives the ground voltage. After the ground voltage is received, the trigger 212c switches the voltage level of the reset signal $S_{RS}$ to the logic high voltage level, and a waveform thereof is shown as the reset signal $S_{RS}$ in FIG. 2C. Moreover, in FIG. 2C, a time delay is generated when the reset signal $S_{RS}$ is changed from the logic low voltage level to the logic high voltage level. This is because that the transistor M2 is switched when the transistor M1 is turned on, and after the trigger signal $S_{TRI}$ switches the voltage level, the transistor M1 is turned off and the transistor M2 is turned on for discharging. Therefore, when the voltage level of a connecting terminal between the transistor M2 and the transistor M1 is decreased enough via the discharging that can drive the trigger 212c to switch the voltage level (for example, the ground voltage) of the output reset signal $S_{RS}$, the voltage level of the control signal $S_{COL}$ is switched to the logic low voltage level.

Next, referring to the trigger signal $S_{TRI}$, the voltage level thereof is changed from the logic high voltage level to a logic low voltage level L1. Now, the transistor is turned on in response to the logic low voltage level, so that the system voltage VCC is transmitted to the trigger 212c via the resistor R2. However, since the resistor R2 generates a voltage drop, the voltage level transmitted to the trigger 212c is not great enough to drive the trigger 212c to switch the voltage level of the reset signal $S_{RS}$. After the voltage level of the reset signal $S_{RS}$ is switched to the logic high voltage level in response to the logic high voltage level of the trigger signal $S_{TRI}$, the logic high voltage level of the trigger signal $S_{TRI}$ then cannot again changes the voltage level of the reset signal $S_{RS}$, so that the voltage level of the reset signal $S_{RS}$ is maintained to the logic high voltage level.

Referring to the trigger signal $S_{TRI}$ and the reset signal $S_{RS}$ of FIG. 2B and FIG. 2C again, the pulse waveform of the trigger signal $S_{TRI}$ can be transmitted to the latch 212a, so as to trigger the latch 212a to transmit the system voltage VCC received from the input terminal D thereof to the output terminal Q. Before the voltage level of the reset signal $S_{RS}$ is switched to the logic high voltage level, since the reset signal $S_{RS}$ has the logic low voltage level, the latch 212a is in the reset state, so that the output terminal Q of the latch 212a outputs the logic low voltage level, and the inverting output terminal $\overline{Q}$ outputs the logic high voltage level. When the voltage level of the reset signal $S_{RS}$ is switched to the logic high voltage level, if the trigger signal $S_{TRI}$ triggers the latch 212a, the latch 212a then transmits the system voltage VCC received from the input terminal D to the output terminal Q, so that the output terminal Q of the latch 212a outputs the system voltage VCC (the system voltage VCC can be regarded as the logic high voltage level), and the inverting output terminal $\overline{Q}$ of the latch 212a outputs the logic low voltage level (i.e. the control signal $S_{COL}$ is at the logic low voltage level).

When the control signal $S_{COL}$ having the logic low voltage level is transmitted to the first terminal of the NAND gate 211a, the output terminal of the NAND gate 211a is in a floating state, i.e. the NAND gate 211a is disconnected from the clock signal $S_{CLK}$, so that the NAND gate 211a cannot inversely amplify the oscillation signal $S_{OSC}$. Now, in the buffer unit 211, only the NAND gate 211b functions, and the gain of the buffer unit 211 is changed to 1. By such means, the noise generated due to excessive amplification of the signal or the poor quality of the crystal X1 can be avoided, so as to avoid influence of the frequency and waveform of the clock signal $S_{CLK}$ due to the noise of different frequency bands loaded into the clock signal $S_{CLK}$.

In other exemplary embodiments of the present invention, the buffer unit 211 of the oscillator 200 can only utilize the NAND gate 211a to inversely amplify the oscillation signal $S_{OSC}$ when the oscillation of the oscillator is started, and after the oscillation is stable, the NAND gate 211b is switched to inversely amplify the oscillation signal $S_{OSC}$. Certainly, in such other exemplary embodiments, the gain of the buffer unit 211 can also be controlled by determining whether the oscillation is stable.

Figure 3A:
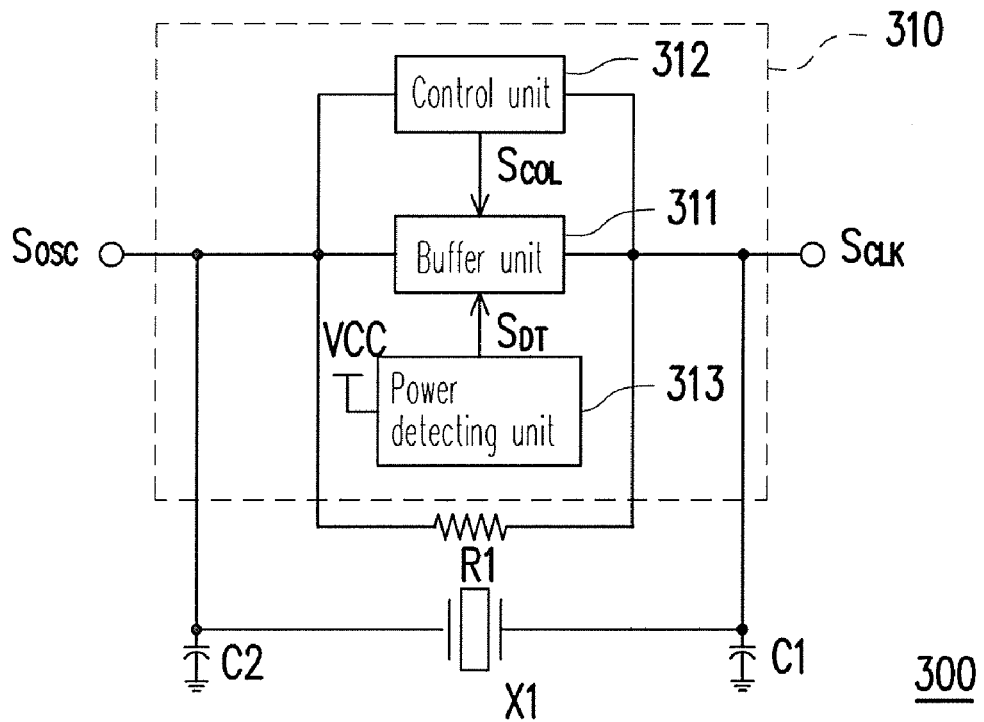
FIG. 3A is a system block diagram illustrating an oscillator according to another exemplary embodiment of the present invention.

Moreover, since before the system voltage VCC is stable, the circuit operation thereof is not stable either. If the circuit design is poor, the oscillator can be influenced. Therefore, a power-detecting unit can be applied to control the buffer unit 211 to start operation after the system voltage VCC is stable. FIG. 3A is a system block diagram illustrating an oscillator according to another exemplary embodiment of the present invention. Referring to FIG. 2A and FIG. 3A, the greatest difference therebetween is a power-detecting unit 313 within the oscillator 300. Operations of a buffer unit 311 and a control unit 312 are similar to that of the buffer unit 211 and the control unit 212 within the oscillator 200, and therefore detailed descriptions thereof are not repeated.

The power-detecting unit 313 is coupled to the buffer unit 311. The power-detecting unit 313 is used to output a detecting signal $S_{DT}$ to the buffer unit 311, and to determine a voltage level of the detecting signal $S_{DT}$ according to whether the system voltage VCC is stable, so as to control the buffer unit 311 whether to amplify the oscillation signal $S_{OSC}$. Wherein, whether the system voltage VCC is stable can be judged according to whether the system voltage VCC reaches a predetermined value. For example, when the system voltage VCC is not stable, the power-detecting unit 313 transmits the detecting signal $S_{DT}$ having the logic low voltage level to the buffer unit 311. When the buffer unit 311 receives the detecting signal $S_{DT}$ having the logic low voltage level, the buffer unit 311 does not amplify the oscillation signal $S_{OSC}$. Conversely, when the system voltage VCC is stable, the power-detecting unit 313 transmits the detecting signal $S_{DT}$ having the logic high voltage level to the buffer unit 311. When the buffer unit 311 receives the detecting signal $S_{DT}$ having the logic high voltage level, the buffer unit 311 amplifies the oscillation signal $S_{OSC}$. By such means, operation of the oscillator under unstable system voltage VCC can be avoided, so as to accelerate an oscillation starting speed of the oscillator 300.

Figure 3B:
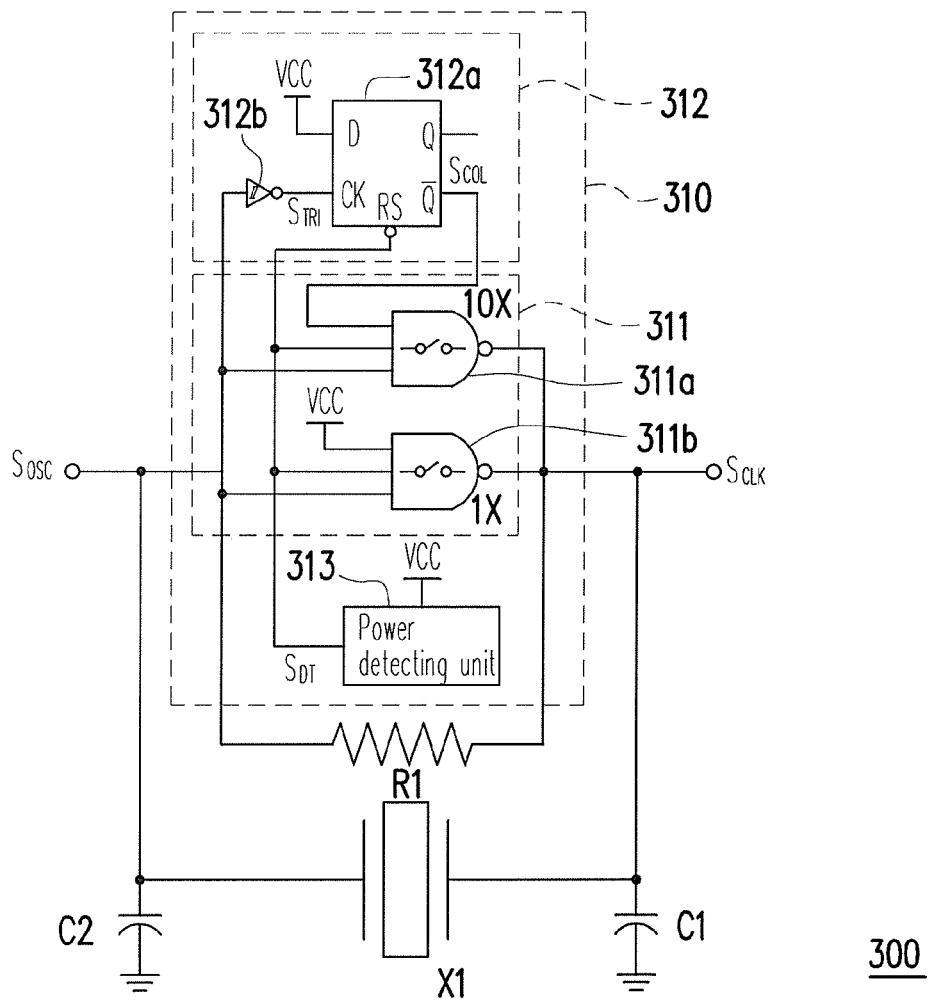
FIG. 3B is a circuit diagram illustrating an oscillator of FIG. 3A.

In the following content, another exemplary embodiment is provided to describe the oscillator 300 in detail. FIG. 3B is a circuit diagram illustrating an oscillator of FIG. 3A. Referring to FIG. 3A and FIG. 3B, in the present exemplary embodiment, the buffer unit 311 includes a third driving device 311a and a fourth driving device 311b, and wherein the third and fourth driving devices 311a and 311b are for example, NAND gates. The control unit 312 includes a second latch module 312a and a third trigger 312b. The second latch module 312a is for example, a D-type latch, and the third trigger 312b is for example a Schmitt inverting trigger. The power-detecting unit can be implemented by a plurality of approaches, for example, implemented by a Schmitt trigger or other approaches known by those skilled in the art. For simplicity's sake, the gain of the NAND gate 311b is for example 1, and the gain of the NAND gate 311a is greater than that of the NAND gate 311b. Here, the gain of the NAND gate 311a is for example 10.

An input terminal D of the latch 312a is coupled to the system voltage VCC, and an trigger terminal CK of the latch 312a is coupled to the trigger 312b. The trigger terminal CK of the latch 312a receives the trigger signal $S_{TRI}$. A reset terminal RS of the latch 312a is coupled to the power-detecting unit 313, and the reset terminal RS of the latch 312a receives the detecting signal $S_{DT}$. An inverting output terminal $\overline{Q}$ of the latch 312a is coupled to the NAND gate 311a, and the inverting output terminal $\overline{Q}$ of the latch 312a outputs the control signal $S_{COL}$ to the NAND gate 311a. A first terminal of the trigger 312b is coupled to the crystal X1, and receives the oscillation signal $S_{OSC}$. A second terminal of the trigger 312b is coupled to the trigger terminal CK of the latch 312a, and provides the trigger signal $S_{TRI}$. The NAND gate 311a has a first terminal, a second terminal, a third terminal and an output terminal. Wherein the first terminal of the NAND gate 311a is coupled to the inverting output terminal $\overline{Q}$ of the latch 312a, and receives the control signal $S_{COL}$. The second terminal of the NAND gate 311a is coupled to the power-detecting unit 312, and receives the detecting signal $S_{DT}$. The third terminal and the output terminal of the NAND gate 311a are coupled in parallel to the crystal X1. The second NAND gate 311b has a first terminal, a second terminal, a third terminal and an output terminal. Wherein the first terminal of the second NAND gate 311b is coupled to the system voltage VCC. The second terminal of the second NAND gate 311b is coupled to the detecting unit 313, and receives the detecting signal $S_{DT}$. The third terminal and the output terminal of the second NAND gate 311b are coupled in parallel to the crystal X1.

Figure 3C:
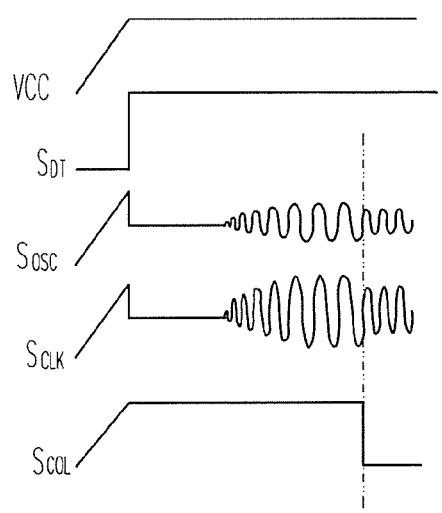
FIG. 3C is a waveform diagram of a system voltage, a detecting signal, a control signal, an oscillation signal and a clock signal of FIG. 3B.

FIG. 3C is a waveform diagram of the system voltage VCC, the detecting signal $S_{DT}$, the control signal $S_{COL}$, the oscillation signal $S_{OSC}$ and the clock signal $S_{CLK}$ of FIG. 3B. Referring FIG. 3B and FIG. 3C, in the present exemplary embodiment, the power-detecting unit 313 first detects whether the system voltage VCC is stable. If the system voltage VCC is not stable, the voltage level of the detecting signal $S_{DT}$ is the logic low voltage level. The latch 312a can be reset in response to the detecting signal $S_{DT}$ having the logic low voltage level, so that the control signal $S_{COL}$ output from the inverting output terminal $\overline{Q}$ of the latch 312a has the logic high voltage level. Similarly, the NAND gates 311a and 311b can also receive the detecting signal $S_{DT}$ having the logic low voltage level, and the detecting signal $S_{DT}$ having the logic low voltage level switches the output terminals of the NAND gates 311a and 311b in the floating state, so that the NAND gates 311a and 311b cannot inversely amplify the oscillation signal $S_{OSC}$. As shown in FIG. 3C, as the system voltage VCC increases, voltage levels of the control signal $S_{COL}$, the oscillation signal $S_{OSC}$ and the clock signal $S_{CLK}$ may correspond to the voltage level of the system voltage VCC.

Next, when the system voltage VCC is stable, the power-detecting unit 313 outputs the detecting signal $S_{DT}$ having the logic high voltage level. Now, the latch 312a is not in the reset state. Since the oscillation signal $S_{OSC}$ cannot drive the trigger 312b to switch the voltage level of the trigger signal $S_{TRI}$, namely, the system voltage VCC received by the input terminal D of the latch 312a cannot be transmitted to the output terminal Q, the inverting output terminal $\overline{Q}$ of the latch 312a can maintain the original logic high voltage level to serve as the voltage level of the control signal $S_{COL}$. When the NAND gates 311a and 311b receive the detecting signal $S_{DT}$ having the logic high voltage level, the NAND gate 311b starts to inversely amplify the oscillation signal $S_{OSC}$. Then, if the control signal $S_{COL}$ having the logic high voltage level is transmitted to the NAND gate 311a, the NAND gate 311a starts to amplify the oscillation signal $S_{OSC}$. Now, the buffer unit 311 starts to amplify the oscillation signal $S_{OSC}$ for starting the oscillation of the oscillator 300, and now the gain of the buffer unit 311 equals to a sum of the gains of the NAND gates 311a and 311b, i.e. the gain of the buffer unit 311 is 11.

Referring to FIG. 3C again, when the oscillation of the oscillator is started, the oscillation signal $S_{OSC}$ and the clock signal $S_{CLK}$ are also from none to some, and amplitudes thereof are gradually increased until a full swing amplitude. Referring to FIG. 3B, when the amplitude of the oscillation signal $S_{OSC}$ is great enough to drive the trigger 312b to switch the voltage level of the trigger signal $S_{TRI}$, the voltage level of the trigger signal $S_{TRI}$ is switched from the logic low voltage level to the logic high voltage level, and such switch operation triggers the latch 312a to transmits the system voltage VCC (regarded to be the logic high voltage level) to the output terminal Q. Meanwhile, the inverting output terminal $\overline{Q}$ of the latch 312a outputs the logic low voltage level to serve as the voltage level of the control signal $S_{COL}$. When the first terminal of the NAND gate 311a receives the control signal $S_{COL}$ having the logic low voltage level, the output terminal of the NAND gate 311a is in the floating state, so that the NAND gate 311a cannot inversely amplify the oscillation signal $S_{OSC}$. Now, in the buffer unit 311, only the NAND gate 311b functions, i.e. the gain of the buffer unit 311 is changed to 1.

Figure 4:
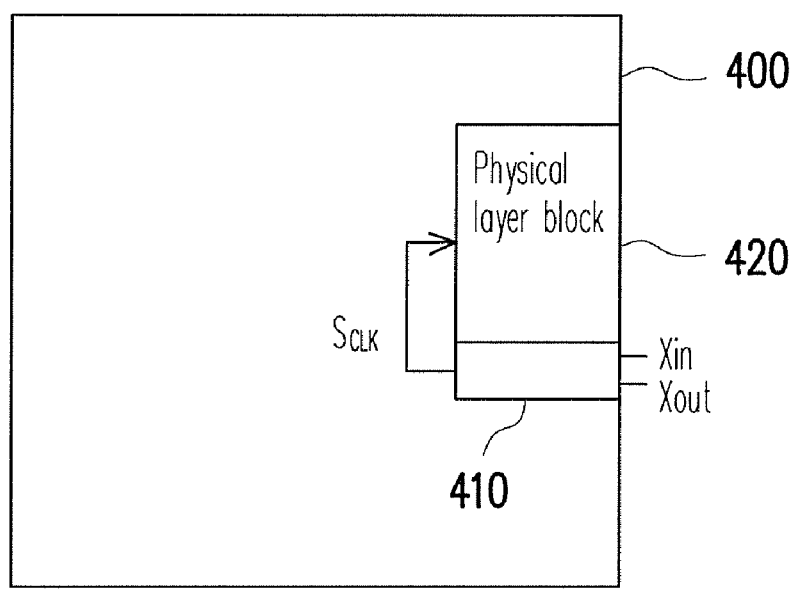
FIG. 4 is an application schematic diagram according to an exemplary embodiment of the present invention.

Components of the aforementioned exemplary embodiment can be integrated into a chip. FIG. 4 is an application schematic diagram according to an exemplary embodiment of the present invention. Referring to FIG. 4, FIG. 4 is a block diagram of a chip 400, and the buffer unit, the control unit, the resistor and even the power-detecting unit of the aforementioned exemplary embodiment can all be integrated into a block 410. Furthermore, pins Xin and Xout are coupled to two ends of the crystal, and are respectively coupled to the capacitors C1 and C2. The clock signal $S_{CLK}$ generated by the oscillator is provided to a physical layer block of the chip 400, so as to operate the chip 400 normally.

Figure 5:
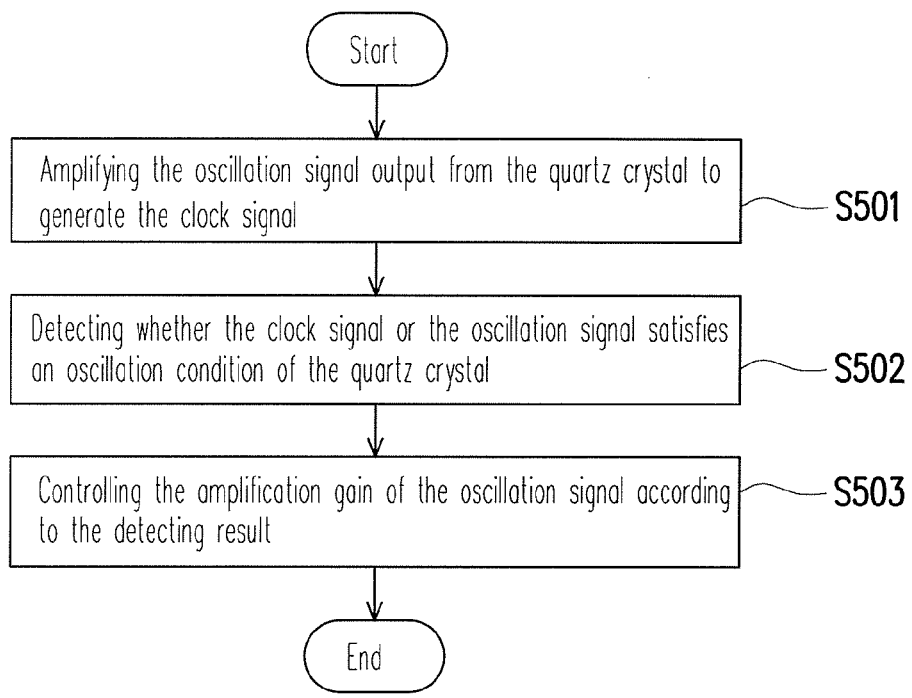
FIG. 5 is a flowchart illustrating an oscillation method according to an exemplary embodiment of the present invention.

According to another aspect, an oscillation method is provided based on the aforementioned exemplary embodiments. In the following content, another exemplary embodiment is provided for describing the oscillation method of the present invention. FIG. 5 is a flowchart illustrating an oscillation method according to an exemplary embodiment of the present invention. Referring to FIG. 5, the oscillation method of the present exemplary embodiment can be applied to the oscillator of FIG. 2A. First, in step S501, the oscillation signal output from the crystal is amplified to generate the clock signal, and now an amplification gain of the oscillation signal is a high amplification gain (for example, a amplification gain is 10). Next, in step S502, whether the clock signal or the oscillation signal satisfies an oscillation condition of the crystal is detected. Finally, in step S503, the amplification gain of the oscillation signal is controlled according to the detecting result, and wherein the detecting result represents whether the clock signal or the oscillation signal satisfies an oscillation condition of the crystal.

For example, if none of the clock signal and the oscillation signal satisfies the oscillation condition of the crystal, the amplification gain of the oscillation signal is not varied (i.e. the amplification gain is 10). Conversely, if the clock signal or the oscillation signal satisfies the oscillation condition of the crystal, the amplification gain of the oscillation signal is then decreased (for example, the amplification gain is 1). Therefore, before the oscillation of the crystal is stable, the high amplification gain is applied to amplify the oscillation signal, so as to accelerate oscillation starting of the crystal. After the oscillation of the crystal is stable, the low amplification gain is applied to amplify the oscillation signal, so as to avoid noises generated due to excessive amplification of the signal and the poor quality of the crystal. Applying the low amplification gain to amplify the oscillation signal is continually performed after the oscillation of the crystal is stable, and such continuous amplification of the oscillation signal corresponds to a stable oscillation waveform of the oscillation signal $S_{OSC}$ of FIG. 2C.

Figure 6:
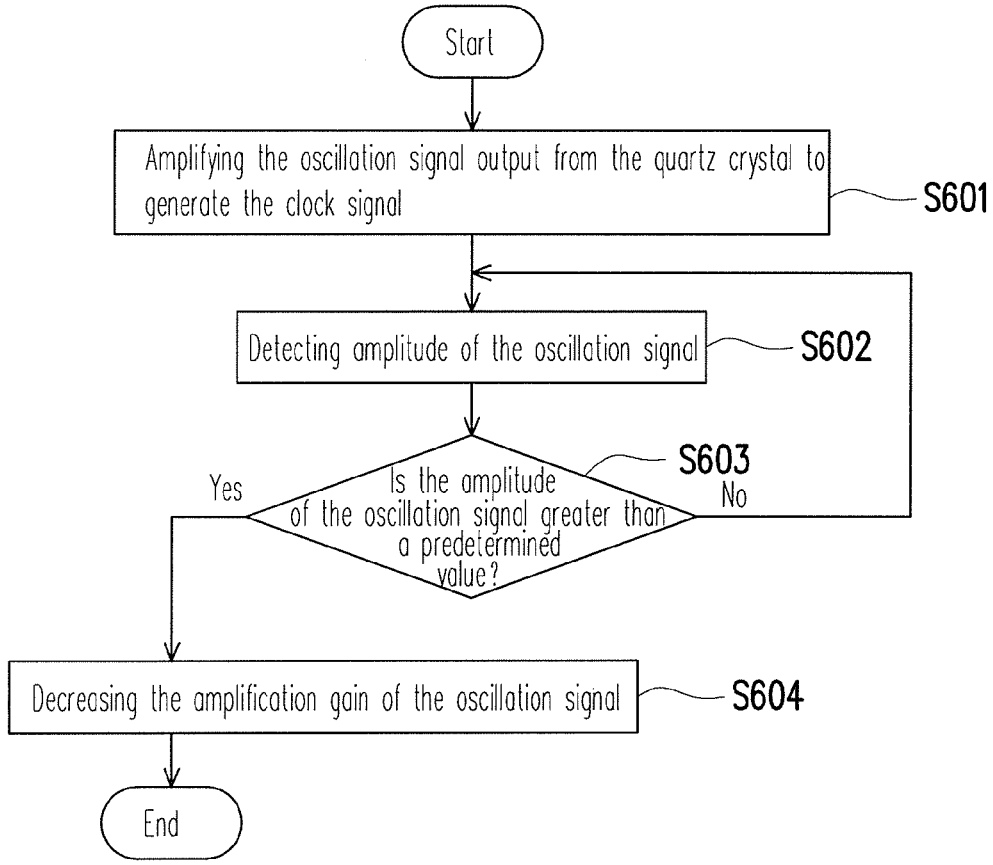
FIG. 6 is a flowchart of an oscillation method according to another exemplary embodiment of the present invention.

Further, another oscillation method is provided for describing an actual operating method of the exemplary embodiment of FIG. 5, and such oscillation method can be applied to the exemplary embodiment of FIG. 2B. FIG. 6 is a flowchart of an oscillation method according to another exemplary embodiment of the present invention. Referring to FIG. 6, in step S601, the oscillation signal output from the crystal is amplified to generate the clock signal, and now the amplification gain of the oscillation signal is for example 10. Next, in step S602, amplitude of the oscillation signal is detected. Next, in step S603, whether the amplitude of the oscillation signal is greater than a predetermined value is judged. Wherein the predetermined value is for example one half of a full swing amplitude of the clock signal $S_{CLK}$, and the predetermined value can be adjusted according to actual requirements. If a judgement result of the step S603 is "negative", namely, the amplitude of the oscillation signal is not greater than the predetermine value, the step S602 is then repeated for continuously detecting the amplitude of the oscillation signal. When the amplitude of the oscillation signal is greater than the predetermined value, the judgement result of the step S603 is "affirmative", and then step S604 is executed for decreasing the amplification gain of the oscillation signal, for example, the amplification gain is decreased to 1.

For the exemplary embodiment of FIG. 5, the amplitude of the clock signal can be detected, or the clock signal and the oscillation signal can be simultaneously detected for confirming whether the oscillation of the crystal is stable, so as to control the amplification gain of the oscillation signal.

Figure 7:
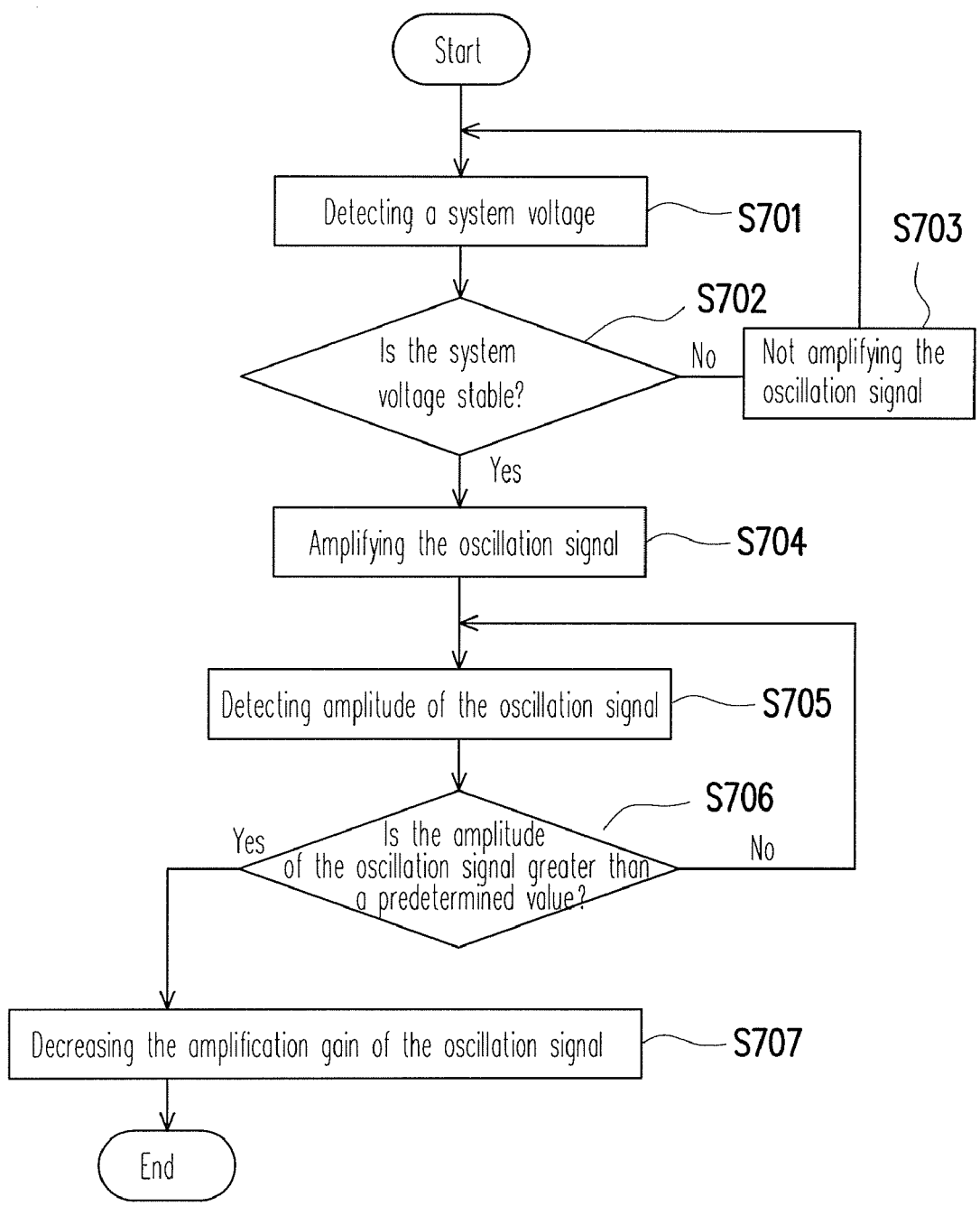
FIG. 7 is a flowchart of an oscillation method according to still another exemplary embodiment of the present invention.

Moreover, an oscillation method that can detect the system voltage is further provided based on the oscillator 300. FIG. 7 is a flowchart of an oscillation method according to still another exemplary embodiment of the present invention. Referring to FIG. 7, in step S701, the system voltage is detected. Next, in step S702, whether the system voltage is stable is judged. If the system voltage is not stable, a judgement result of the step S702 is then "negative", and step S703 is executed, by which the oscillation signal is not amplified. Then, the step S701 is repeated for continuously detecting the system voltage. Before the system voltage is stable, the steps S701-S703 are continuously repeated. When the system voltage is stable, the judgement result of the step S702 is then "affirmative", and step S704 is executed for amplifying the oscillation signal. Here, the amplification gain of the oscillation signal is for example 10. Thereafter, amplification of the oscillation signal is continuously performed. Next, in step S705, the amplitude of the oscillation signal is detected. Next, in step S706, whether the amplitude of the oscillation signal is greater than the predetermined value is judged, wherein the predetermined value is for example one half of a full swing amplitude of the clock signal. If a judgement result of the step S706 is "negative", namely, the amplitude of the oscillation signal is not greater than the predetermine value, the step S705 is then repeated for continuously detecting the amplitude of the oscillation signal. When the amplitude of the oscillation signal is greater than the predetermined value, the judgement result of the step S706 is "affirmative", and step S707 is executed for decreasing the amplification gain of the oscillation signal, for example, the amplification gain is decreased to 1. Moreover, it should be noted that the method can be implemented by a software, a firmware, or a hardware.

In summary, according to the oscillator, and the driving circuit and the oscillation method thereof of the present invention, whether the system voltage is stable is detected first, so as to determine whether to amplify the oscillation signal. When the system voltage is stable, the oscillation signal is amplified to accelerate the oscillation starting of the crystal. Next, whether the oscillation of the crystal is stable is determined by detecting the clock signal or the oscillation signal, and after the oscillation is stable, the amplification gain of the oscillation signal is decreased to avoid excessive amplification of the noise generated by the crystal. By such means, oscillation starting speed of the crystal can be accelerated, and excessive amplification of the noise generated by the crystal can be avoided, so that loading of the noise of different frequency bands into the clock signal is avoided, and a frequency stability of the clock signal is improved.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A driving circuit, coupled in parallel to a crystal for generating a clock signal, comprising:
   a buffer unit, coupled in parallel to the crystal, for amplifying an oscillation signal output from the crystal to generate the clock signal; and
   a control unit, coupled to the buffer unit, for generating a control signal to the buffer unit, wherein the control unit controls a gain of the buffer unit by detecting whether the clock signal or the oscillation signal satisfies an oscillation condition of the crystal, a voltage level of the control signal is determined according to voltage levels of a trigger signal and a reset signal, and the gain of the buffer unit is controlled according to the voltage level of the control signal, wherein the oscillation condition comprises a condition that amplitude of the oscillation signal is greater than a first predetermined value.

2. The driving circuit as claimed in claim 1, wherein the control unit comprises:
   a first latch module, having an input terminal, an output terminal, a trigger terminal and a reset terminal, wherein the input terminal is coupled to a system voltage, the trigger terminal receives the trigger signal, the reset terminal receives the reset signal, and the first latch module determines the voltage level of the control signal according to the voltage levels of the trigger signal and the reset signal, and outputs the control signal from the output terminal; and
   a detecting module, having an input terminal, a first output terminal and a second output terminal, wherein the input terminal receives the oscillation signal, the first output terminal is coupled to the trigger terminal of the first latch module, the second output terminal is coupled to the reset terminal of the first latch module, and the detecting module determines the voltage levels of the trigger signal and the reset signal according to the oscillation signal.

3. The driving circuit as claimed in claim 2, wherein the first latch module is a latch.

4. The driving circuit as claimed in claim 3, wherein the latch is a D-type latch.

5. The driving circuit as claimed in claim 2, wherein the detecting module comprises:
   a first trigger, having a first terminal and a second terminal, wherein the first terminal is coupled to the crystal, and the second terminal is coupled to the trigger terminal of the first latch module, and if amplitude of the oscillation signal is greater than the predetermined value, the voltage level of the trigger signal is switched;
   a second trigger, having a first terminal and a second terminal, wherein the second terminal is coupled to the reset terminal of the first latch module;
   a resistor, having a first terminal coupled to the system voltage;
   a first transistor, having a source coupled to a second terminal of the resistor, a drain coupled to the first terminal of the second trigger, and a gate coupled to the second terminal of the first trigger; and
   a second transistor, having a drain coupled to the first terminal of the second trigger, a source coupled to a ground voltage, and a gate coupled to the second terminal of the first trigger, wherein during a period, only one of the first transistor and the second transistor is turned on, and when the second trigger receives the ground voltage, the second trigger switches the voltage level of the reset signal.

6. The driving circuit as claimed in claim 5, wherein the first and the second transistors are respectively a PMOS transistor and a NMOS transistor.

7. The driving circuit as claimed in claim 5, wherein the first and the second triggers are Schmitt triggers.

8. The driving circuit as claimed in claim 2, wherein after the buffer unit receives the control signal, a gain lower than that applied before the control signal is received is applied.

9. The driving circuit as claimed in claim 8, wherein the buffer unit comprises:
a plurality of driving devices, wherein the driving devices are all used for amplifying the oscillation signal, and after the buffer unit receives the control signal, at least one of the driving devices is disconnected from the crystal.

10. The driving circuit as claimed in claim 8, wherein the buffer unit comprises:
a first driving device, having a first terminal, a second terminal and an output terminal, wherein the first terminal is coupled to the output terminal of the first latch module, the second terminal is coupled to the crystal, and if a voltage level of the control signal is a predetermined voltage level, the oscillation signal is amplified by the first driving device; and
a second driving device, having a first terminal, a second terminal and an output terminal, wherein the first terminal is coupled to the system voltage, and the second terminal is coupled to the crystal for amplifying the oscillation signal,
wherein a gain of the first driving device is greater than that of the second driving device.

11. The driving circuit as claimed in claim 10, wherein the predetermined voltage level is a logic high voltage level.

12. The driving circuit as claimed in claim 10, wherein the first and the second driving devices are NAND gates.

13. The driving circuit as claimed in claim 1, further comprising:
a power-detecting unit, coupled to the buffer unit, for outputting a detecting signal to the buffer unit, wherein the power-detecting unit controls the buffer unit whether to amplify the oscillation signal via the detecting signal according to whether the system voltage reaches a second predetermined value.

14. The driving circuit as claimed in claim 13, wherein the control unit comprises:
a second latch module, having an input terminal coupled to the system voltage, a trigger terminal receiving the trigger signal, a reset terminal coupled to the power-detecting unit, and an output terminal outputting the control signal, wherein the second latch module determines a voltage level of the control signal according to voltage levels of the trigger signal and the detecting signal, and outputs the control signal via the output terminal thereof; and
a third trigger, having a first terminal coupled to the crystal, and a second terminal coupled to the trigger terminal of the second latch module, the third trigger is used to generate the trigger signal according to the oscillation signal.

15. The driving circuit as claimed in claim 14, wherein the second latch module is a latch.

16. The driving circuit as claimed in claim 15, wherein the latch is a D-type latch.

17. The driving circuit as claimed in claim 14, wherein the third trigger is a Schmitt inverting trigger.

18. The driving circuit as claimed in claim 14, wherein the buffer unit comprising:
a third driving device, having a first terminal, a second terminal, a third terminal and an output terminal, wherein the first terminal is coupled to the output terminal of the second latch module, the second terminal is coupled to the crystal, and the third terminal is coupled to the power-detecting unit, and the third driving device determines whether to amplify the oscillation signal according to voltage levels of the control signal and the detecting signal; and
a fourth driving device, having a first terminal, a second terminal, a third terminal and an output terminal, wherein the first terminal is coupled to the system voltage, the second terminal is coupled to the crystal, and the third terminal is coupled to the power-detecting unit, and the fourth driving device determines whether to amplify the oscillation signal according to the voltage level of the detecting signal,
wherein a gain of the third driving device is greater than that of the fourth driving device.

19. The driving circuit as claimed in claim 18, wherein the third and the fourth driving devices are NAND gates.

20. An oscillator, comprising:
a crystal; and
a driving circuit, coupled in parallel to the crystal, for generating a clock signal, comprising:
a buffer unit, coupled in parallel to the crystal, for amplifying an oscillation signal output from the crystal to generate the clock signal; and
a control unit, coupled to the buffer unit for generating a control signal to the buffer unit, wherein the control unit controls a gain of the buffer unit by detecting whether the clock signal or the oscillation signal satisfies an oscillation condition of the crystal, a voltage level of the control signal is determined according to voltage levels of a trigger signal and a reset signal, and the gain of the buffer unit is controlled according to the voltage level of the control signal, wherein the oscillation condition comprises a condition that amplitude of the oscillation signal is greater than a first predetermined value.

21. The oscillator as claimed in claim 20, wherein the control unit comprises:
a first latch module, having an input terminal, an output terminal, a trigger terminal and a reset terminal, wherein the input terminal is coupled to a system voltage, the trigger terminal receives the trigger signal, the reset terminal receives the reset signal, and the first latch module determines the voltage level of the control signal according to the voltage levels of the trigger signal and the reset signal, and outputs the control signal from the output terminal; and
a detecting module, having an input terminal, a first output terminal and a second output terminal, wherein the input terminal receives the oscillation signal, the first output terminal is coupled to the trigger terminal of the first latch module, the second output terminal is coupled to the reset terminal of the first latch module, and the detecting module is used to determine the voltage levels of the trigger signal and the reset signal according to the oscillation signal.

22. The oscillator as claimed in claim 20, wherein after the buffer unit receives the control signal, a gain lower than that applied before the control signal is received is applied.

23. The oscillator as claimed in claim 22, wherein the buffer unit comprises:
- a plurality of driving devices, wherein the driving devices are all used for amplifying the oscillation signal,
- wherein at least one of the driving devices is disconnected from the crystal after the control signal is received.

24. The oscillator as claimed in claim 20, further comprising:
- a power-detecting unit, coupled to the buffer unit, for outputting a detecting signal to the buffer unit, wherein the power-detecting unit controls the buffer unit whether to amplify the oscillation signal via the detecting signal according to whether the system voltage reaches a second predetermined value.

25. The oscillator as claimed in claim 24, wherein the buffer unit comprises:
- a third driving device, having a first terminal, a second terminal, a third terminal and an output terminal, wherein the first terminal is coupled to an output terminal of a second latch module, the second terminal is coupled to the crystal, and the third terminal is coupled to the power-detecting unit, and the third driving device determines whether to amplify the oscillation signal according to voltage levels of the control signal and the detecting signal; and
- a fourth driving device, having a first terminal, a second terminal, a third terminal and an output terminal, wherein the first terminal is coupled to the system voltage, the second terminal is coupled to the crystal, and the third terminal is coupled to the power-detecting unit, and the fourth driving device determines whether to amplify the oscillation signal according to the voltage level of the detecting signal,
- wherein a gain of the third driving device is greater than that of the fourth driving device.

26. An oscillation method of an oscillator for driving an oscillator having a crystal to generate a clock signal, the oscillation method comprising:
- amplifying an oscillation signal output from the crystal to generate the clock signal;
- detecting whether the clock signal or the oscillation signal satisfies an oscillation condition of the crystal so as to determine a voltage level of a control signal; and
- controlling an amplification gain of the oscillation signal according to the voltage level of the control signal, wherein the voltage level of the control signal represents whether the clock signal or the oscillation signal satisfies an oscillation condition of the crystal, the voltage level of the control signal is determined according to voltage levels of a trigger signal and a reset signal and the amplification gain of the oscillation signal is controlled according to the voltage level of the control signal, wherein the oscillation condition comprises a condition that amplitude of the oscillation signal is greater than a first predetermined value.

27. The oscillation method of an oscillator as claimed in claim 26, wherein steps of controlling a gain of the buffer unit according to the detecting result comprise:
- controlling the gain if amplitude of the oscillation signal is greater than a predetermined value; and
- maintaining the gain if the amplitude of the oscillation signal is not greater than the predetermined value.

28. The oscillation method of an oscillator as claimed in claim 27, further comprising:
- detecting a system voltage;
- judging whether the system voltage is stable;
- not amplifying the oscillation signal if the system voltage is not stable; and
- amplifying the oscillation signal if the system voltage is stable.

* * * * *